United States Patent

Murata et al.

[11] Patent Number: 5,909,185
[45] Date of Patent: Jun. 1, 1999

[54] LOOKUP TABLE DEVICE AND SIGNAL CONVERSION METHOD

[75] Inventors: Hiroyuki Murata, Shinagawa-ku; Takashi Yokota, Yokohama; Katsuhiro Miura, Ichikawa, all of Japan

[73] Assignee: Namco Ltd., Tokyo, Japan

[21] Appl. No.: 08/945,145

[22] PCT Filed: Feb. 19, 1997

[86] PCT No.: PCT/JP97/00443

§ 371 Date: Oct. 20, 1997

§ 102(e) Date: Oct. 20, 1997

[30] Foreign Application Priority Data

Feb. 26, 1996 [JP] Japan .................................. 8-63783

[51] Int. Cl.[6] .................................................. H03M 7/00
[52] U.S. Cl. .................................................. 341/106
[58] Field of Search ................................ 341/58, 59, 106

[56] References Cited

U.S. PATENT DOCUMENTS 5,117,385  5/1992  Gee .......................................... 364/757
5,313,611  5/1994  Franklin et al. ........................ 395/425

FOREIGN PATENT DOCUMENTS

A-56-123037  9/1981  Japan .
A-61-5628    1/1986  Japan .

OTHER PUBLICATIONS

Translation of JP 56-123037 A.

*Primary Examiner*—Howard L. Williams
*Attorney, Agent, or Firm*—Oliff & Berridge, PLC

[57] ABSTRACT

A lookup table device is provided which converts a digital input signal into a digital output signal previously defined with respect to the digital input signal. The lookup table device has a delimiter information storage unit 10 for storing delimiter information representing a delimiter in a section of the digital input signal corresponding to the digital output signal, a section deriving unit 12 for deriving a section to which a digital input signal belongs, based on the delimiter information stored in the delimiter information storage unit, when the digital input signal is inputted into the lookup table device, and a signal output unit 14 for outputting a digital output signal corresponding to the section derived by the section deriving unit.

8 Claims, 11 Drawing Sheets

| DIGITAL INPUT SIGNAL | SECTION |
|---|---|
| 00000~01000 | 0 |
| 01001~10000 | 1 |
| 10001~10011 | 2 |
| 10100~10110 | 3 |
| 10111~11001 | 4 |
| 11010~11111 | 5 |

FIG. 3B

| SECTION | DIGITAL OUTPUT SIGNAL |
|---|---|
| 0 | 00010 |
| 1 | 01111 |
| 2 | 10110 |
| 3 | 00111 |
| 4 | 01100 |
| 5 | 00101 |

| DIGITAL INPUT SIGNAL | SECTION |
|---|---|
| 00000 | 0000 |
| 00001 | 0001 |
| 00010 | 0010 |
| 00011 | 0011 |
| 00100~00101 | 0100 |
| 00110~01000 | 0101 |
| 01001~01100 | 0110 |
| 01101~10010 | 0111 |
| 10011~10101 | 1000 |
| 10110~10111 | 1001 |
| 11000~11001 | 1010 |
| 11010 | 1011 |
| 11011 | 1100 |
| 11100 | 1101 |
| 11101 | 1110 |
| 11110~11111 | 1111 |

| DELIMITER INFORMATION | SECTION |
|---|---|
| 0 0 0 0 0 | 0 0 0 0 |
| 0 0 0 0 1 | 0 0 0 1 |
| 0 0 0 1 0 | 0 0 1 0 |
| 0 0 0 1 1 | 0 0 1 1 |
| 0 0 1 0 1 | 0 1 0 0 |
| 0 1 0 0 0 | 0 1 0 1 |
| 0 1 1 0 0 | 0 1 1 0 |
| 1 0 0 1 0 | 0 1 1 1 |
| 1 0 1 0 1 | 1 0 0 0 |
| 1 0 1 1 1 | 1 0 0 1 |
| 1 1 0 0 1 | 1 0 1 0 |
| 1 1 0 1 0 | 1 0 1 1 |
| 1 1 0 1 1 | 1 1 0 0 |
| 1 1 1 0 0 | 1 1 0 1 |
| 1 1 1 0 1 | 1 1 1 0 |

| DIGITAL INPUT SIGNAL | DIGITAL OUTPUT SIGNAL |
|---|---|
| 00000 | 0000 |
| 00001~00010 | 0001 |
| 00011 | 0011 |
| 00100~00101 | 0100 |
| 00110~10010 | 0111 |
| 10011~10101 | 1000 |
| 10110~10111 | 1001 |
| 11000~11001 | 1010 |
| 11010~11111 | 1011 |

FIG.11

| DELIMITER INFORMATION | SECTION |
|---|---|
| 0 0 0 0 0 | 0 0 0 0 |
| 0 0 0 1 0 | 0 0 0 1 |
| 0 0 0 1 0 | 0 0 1 0 |
| 0 0 0 1 1 | 0 0 1 1 |
| 0 0 1 0 1 | 0 1 0 0 |
| 0 0 1 0 1 | 0 1 0 1 |
| 0 0 1 0 1 | 0 1 1 0 |
| 1 0 0 1 0 | 0 1 1 1 |
| 1 0 1 0 1 | 1 0 0 0 |
| 1 0 1 1 1 | 1 0 0 1 |
| 1 1 0 0 1 | 1 0 1 0 |
| 1 1 1 1 1 | 1 0 1 1 |
| 1 1 1 1 1 | 1 1 0 0 |
| 1 1 1 1 1 | 1 1 0 1 |
| 1 1 1 1 1 | 1 1 1 0 |

P (arrow pointing to third row)
Q (arrow pointing to last row)

LOOKUP TABLE DEVICE AND SIGNAL CONVERSION METHOD

TECHNICAL FIELD

The present invention relates to a lookup table device and a signal conversion method. Particularly, it relates to a lookup table device for outputting an output signal previously defined in a table in response to a received input signal, and a signal conversion method used therein.

DESCRIPTION OF THE PRIOR ART

There is known a lookup table device for outputting a digital signal previously defined in a table, in response to a received digital input signal.

Such a lookup table device includes a memory having an n-bit address bus and a k-bit data bus, the address bus being used as an input signal line and the data bus being used as an output signal line. In the lookup table device, digital k-bit output signals are stored as a table in $2^n$ storage areas which correspond to digital n-bit input signals, respectively. Thus, such a lookup table device requires a memory having a capacity of at least $2^n \times k$ bits.

Thus, this raised a problem in that if the value of n or k become larger, the table itself increased, resulting in increase of the necessary memory capacity. Particularly, if the value of n becomes larger, the necessary memory capacity exponentially increases in accordance with 2n. It was thus desired to provide a lookup table device which can reduce the memory capacity. If the necessary memory capacity increases in such a manner, time required to renew the table values will also increase. Therefore, this is not suitable for any application wherein the table values must be renewed at high speed.

In view of the aforementioned problem, an object of the present invention is to provide a lookup table device which can reduce the number of table values to be stored, resulting in reduction of the necessary memory capacity, and a signal conversion method used therein.

DISCLOSURE OF INVENTION

The present invention thus provides a lookup table device for converting a digital input signal into a digital output signal previously defined in correspondence to the digital input signal, comprising:

a delimiter information storage means for storing delimiter information representing a delimiter in the section of the digital input signal corresponding to the respective values of the digital output signal;

section deriving means for deriving a section to which the digital input signal belongs, based on the delimiter information stored in the delimiter information storage means, when the digital input signal is inputted; and signal output means for outputting the digital output signal corresponding to a section derived by the section deriving means.

According to the lookup table device of the present invention, each value of the digital output signals corresponds to any of the sections. In other words, the value of the digital input signal is divided into a plurality of sections. A digital input signal belonging to each section will correspond to a digital output signal having the same value.

When a digital input signal is inputted into the section deriving means, the section deriving means derives a section to which the digital input signal belongs on the basis of the delimiter information stored in the delimiter information storage means. The delimiter information stored in the delimiter information storage means is information required to derive the section to which the digital input signal belongs. Such information may be the value of the digital input signal representing the delimiter of the section, for example.

Thereafter, the signal output means outputs the digital output signal corresponding to the section derived by the section deriving means.

According to the present invention, it is not required to pre-store the same numbers of digital output signals which are equal value as all the successive values of the digital input signal, when the successive values of the digital input signals correspond to one and the same value of the digital output signals. This can reduce the necessary memory capacity.

As a result of reducing the number of table values which represent the relationship between the digital input and output signals, the table values can more quickly be written into the memory means.

In an aspect of the present invention, it is preferred that the signal output means includes output signal value storage means for storing the value of the digital output signal corresponding to the respective the sections, and outputs the digital output signal value corresponding to the section derived by the section deriving means among the digital output signal values stored in the output signal value storage means.

In such a case, the lookup table device comprises the output signal value storage means included in the signal output means. The output signal value storage means stores the values of the digital output signal corresponding to the respective sections. When a section to which a digital input signal belongs is derived by the section deriving means, the signal output means reads the value of a digital output signal corresponding to that section out of the output signal value storage means then the output signal is in turn outputted.

Thus, it is not required to previously store the same numbers of digital output signals which are equal value as all the successive values of the digital input signal. This can reduce the necessary memory capacity.

As a result of reducing the number of table values which represent the relationship between the digital input and output signals, the table values can more quickly be written into the memory means.

The present invention also provides a lookup table device for converting a digital input signal input through an n-bit signal line into a digital output signal which has previously defined to monotonously increase or decrease its value corresponding to increase of the digital input signal value and which will be outputted through a k-bit signal line, comprising:

delimiter information storage means for storing delimiter information representing delimiters in $2^k$ numbers of sections of the digital input signal and corresponding to the respective value of the digital output signal;

section deriving means for deriving a section to which the digital input signal belongs, based on the delimiter information stored in the delimiter information storage means, when the digital input signal is inputted; and signal output means for outputting the digital output signal corresponding to a section derived by the section deriving means.

According to the lookup table device of the present invention, the value of a digital input signal is divided into $2^k$ sections. The same and one value of a digital output signal corresponds to a group of digital input signals belonging to the respective one of the sections. It is defined herein that the number of the sections in the digital input signals is $2^k$ which is equal to the number of the digital output signal. The value of the digital output signal simply increases or decreases in correspondence to increase of the value of the digital input signal. As a result, each of the sections in the digital input signal simply corresponds to the digital output signal.

Thus, according to the lookup table device of the present invention the digital input signal can correspond to the digital output signal in the above manner. When a digital input signal is inputted into the section deriving means, the section deriving means derives a section to which the digital input signal belongs on the basis of the delimiter information stored in the delimiter information storage means. The delimiter information stored in the delimiter information storage means is information that is required to derive the section to which the digital input signal belongs. The value of the digital input signal representing the delimiter in the section may be used as this information.

Thereafter, the signal output means derives the value of the digital output signal corresponding to the section derived by the section deriving means. At this point, the information representing the section outputted from the section deriving means unitarily corresponds to the value of the digital output signal. Thus, for example, the information representing the section can be outputted directly as a digital output signal without having previously stored the value of the digital output signal as a table.

It is preferred that the delimiter information storage means stores the delimiter information so that the digital output signal which does not correspond to any digital input signal and will not be outputted corresponds to a virtual section of which section width is zero.

According to the lookup table device, a digital output signal any one of which values $2^k$ does not correspond to any digital input signal. The digital output signal which will not be outputted may correspond to a section of a virtual digital input signal having zero in width. Namely, the delimiter information storage means stores the delimiter information so that a virtual section having zero in width may correspond to a digital output signal which does not correspond to any digital input signal and will not be outputted.

In this manner, the information representing the section outputted from the section deriving means can simply correspond to the value of the digital output signal even if the $2^k$ digital output signals include a digital output signal which will not actually be outputted by the signal output means.

The present invention further provides a method of signal conversion for converting a digital input signal into a digital output signal previously defined with respect to the digital input signal, comprising the steps of:

defining sections in the digital input signal corresponding to the respective output values of the digital output signal and, storing delimiter information representing delimiters in these sections in delimiter information storage means;

deriving a section to which the digital input signal belongs, based on the delimiter information stored in the delimiter information storage means, when the digital input signal is inputted thereinto; and outputting the digital output signal corresponding to the derived section.

According to the method of signal conversion in the present invention, the respective one of the sections corresponds to the respective values of the digital output signal. In other words, the number of the digital input signal values are divided into a plurality of sections, and one and the same value of the digital output signal corresponds to digital input signals which belong to the respective sections.

The delimiter information storage means has stored delimiter information required to derive a section to which the digital input signal belongs. The delimiter information may be the value of a digital input signal representing the section delimiter, for example.

When a digital input signal is inputted, the signal conversion method of the present invention first derives a section to which the digital input signal belongs on the basis of the delimiter information stored in the delimiter information storage means. Thereafter, a digital output signal corresponding to the derived section is outputted.

According to the signal conversion method of the present invention, it is not required to pre-store the same numbers of digital output signals which are equal value as all of the successive values of the digital input signal, when the successive values of the digital input signals correspond to one and the same value of the digital output signals. This can reduce the necessary memory capacity.

As a result of reducing the number of table values which represent the relationship between the digital input and output signals, the table values can more quickly be written into the memory means.

The present invention further provides a method of signal conversion for converting a digital input signal into a digital output signal previously defined with respect to the digital input signal, comprising the steps of:

defining sections in the digital input signal corresponding to the respective output values of the digital output signal, storing delimiter information representing delimiters in these sections in delimiter information storage means, and storing the value of the digital output signal corresponding to each of the sections in output signal value storage means;

deriving a section to which the digital input signal belongs, based on the delimiter information stored in the delimiter information storage means, when the digital input signal is inputted thereinto; and selecting and outputting the digital output signal corresponding to the derived section from the values of the digital output signal stored in the output signal value storage means.

According to the signal conversion method of the present invention, the respective one of the sections corresponds to the corresponding one of the values of the digital output signal. In other words, the value of the digital input signal is divided into a plurality of sections, and the digital input signal which belongs to the respective sections corresponds to one and the same number of the digital output signal.

The delimiter information storage means store delimiter information required to derive a section to which the digital input signal belongs. The delimiter information may be the value of a digital input signal representing the section delimiter, for example.

The output signal value storage means has stored the values of the digital output signal to be outputted corresponding to the respective sections.

When a digital input signal is inputted, the signal conversion method of the present invention first derives a section to which the digital input signal belongs on the basis of the delimiter information stored in the delimiter information storage means.

Thereafter, the value of a digital output signal corresponding to the derived section is read out of the output signal value storage means and then outputted as a digital output signal.

According to the signal conversion method of the present invention, it is not required to pre-store the same numbers of digital output signals which are equal value as all the successive values of the digital input signal, when the successive values of the digital input signals correspond to one and the same value of the digital output signals. This can reduce the necessary memory capacity.

As a result of reducing the number of table values which represent the relationship between the digital input and output signals, the table values can more quickly be written into the memory means.

The present invention further provides a method of signal conversion for converting a digital input signal input through an n-bit signal line into a digital output signal which has previously defined to monotonously increase or decrease its value simply corresponding to increase of the digital input signal value and which will be outputted through a k-bit signal line, comprising the steps of:

dividing the digital input signal into $2^k$ numbers of sections corresponding to the respective values of the digital output signal, and storing delimiter information representing a delimiter of the section in delimiter information storage means;

deriving a section to which the digital input signal belongs, based on the delimiter information stored in the delimiter information storage means, when the digital input signal is inputted; and outputting the digital output signal corresponding to a section to be derived, According to the signal conversion method of the present invention, the value of a digital input signal is divided into $2^k$ sections, and one and the same value of a digital input signal belonging to the respective one of the sections corresponds to a digital output signal. It is defined herein that the number of the sections in the digital input signal is $2^k$ which is equal to the number of values taken by the digital output signal and that the value of the digital output signal simply increases or decreases in correspondence to increase of the value of the digital input signal. As a result, each of the sections in the digital input signal unitarily corresponds to the digital output signal.

In the signal conversion method of the present invention, the delimiter information storage means has stored delimiter information representing the delimiters in the defined sections.

When a digital input signal is inputted, a section to which the digital input signal belongs is derived based on the delimiter information stored in the delimiter information storage means. The delimiter information stored in the delimiter information storage means is information that is required to derive the section to which the digital input signal belongs and that may be the value of the digital input signal representing the delimiter in the section, for example.

Thereafter, the value of the digital output signal corresponding to the section thus derived is derived. At this point, the information representing the section outputted from the section deriving unit unitarily corresponds to the value of the digital output signal. Thus, for example, the information representing the section can be outputted directly as a digital output signal without having previously stored the value of the digital output signal as a table.

It is preferred that the delimiter information storage means stores the delimiter information so that the digital output signal which does not correspond to any digital input signal and will not be outputted corresponds to a virtual section of which section width is zero.

According to the lookup table device, a digital output signal any one of which values $2^k$ does not correspond to any digital input signal. The digital output signal which will not be outputted may correspond to a section of a virtual digital input signal having zero in width. Namely, the delimiter information storage means stores the delimiter information so that a virtual section having zero in width corresponds to a digital output signal which does not correspond to any digital input signal and will not be outputted.

In this manner, the information representing the section outputted from the section deriving means can correspond unitarily to the value of the digital output signal, even if the $2^k$ digital output signals include a digital output signal which will not actually be outputted by the signal output means.

BEST MODES FOR CARRYING OUT THE INVENTION

Some preferred embodiments of the present invention will now be described with reference to the drawings.

First Embodiment

The first embodiment relates to a lookup table device for converting a digital input signal into a digital output signal which has previously be defined.

Figure 1:
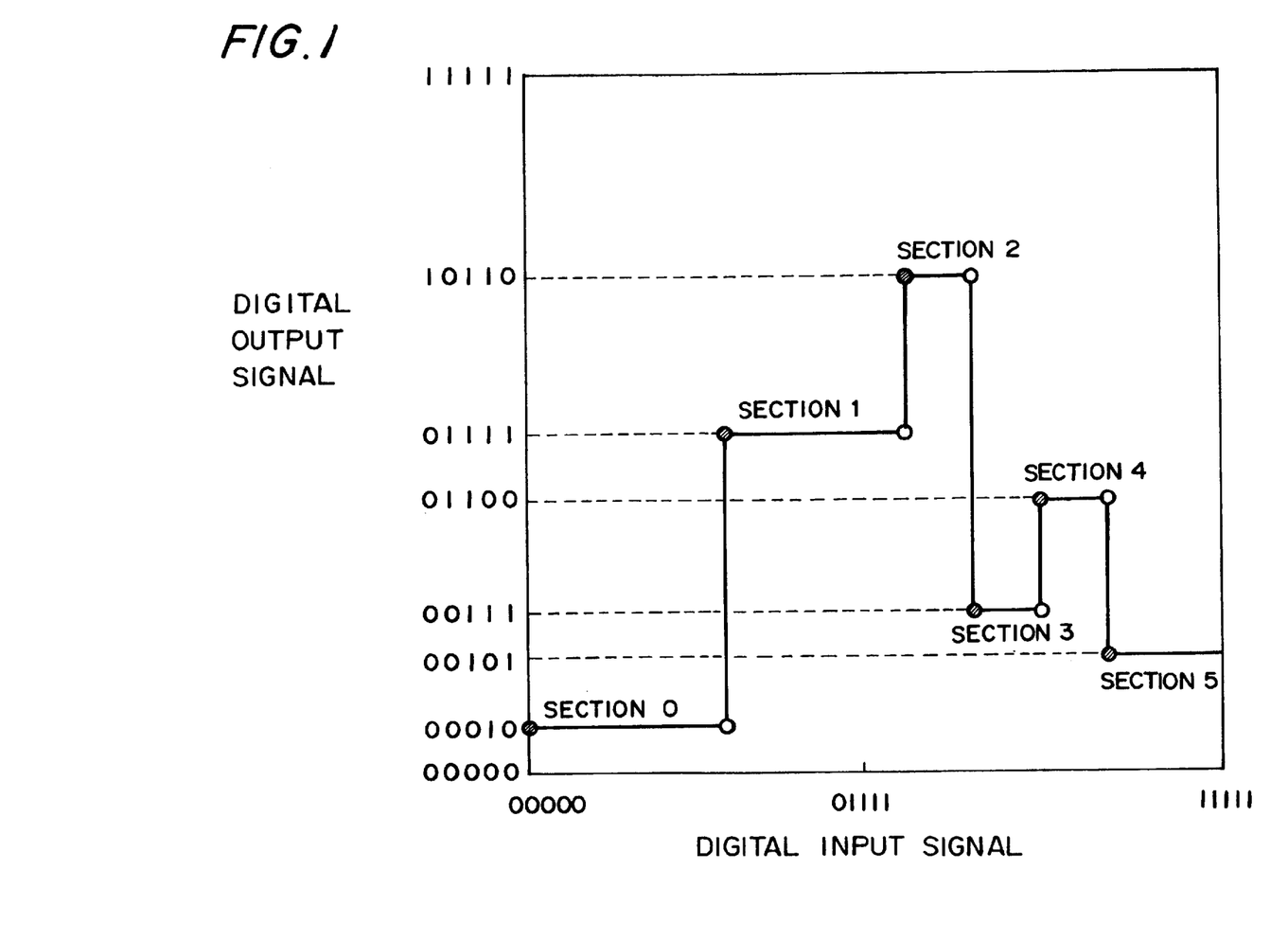
FIG. 1 is a view illustrating the relationship between digital input and output signals in a lookup table device according to a first embodiment of the present invention.

FIG. 1 is a view illustrating the relationship between digital input and output signals in the lookup table device. In this figure, the abscissa axis shows the values of the digital input signal represented by binary numbers while the ordinate axis shows the values of the digital output signal represented by binary numbers. As shown in FIG. 1, the lookup table device has previously defined six values as digital output signals. A digital input signal corresponding to the respective value of the digital output signal is divided into six sections. In other words, an output value corresponding to each of the successive digital input signal values is defined to the sections 0 to 5 of the digital input signal.

Figure 2:
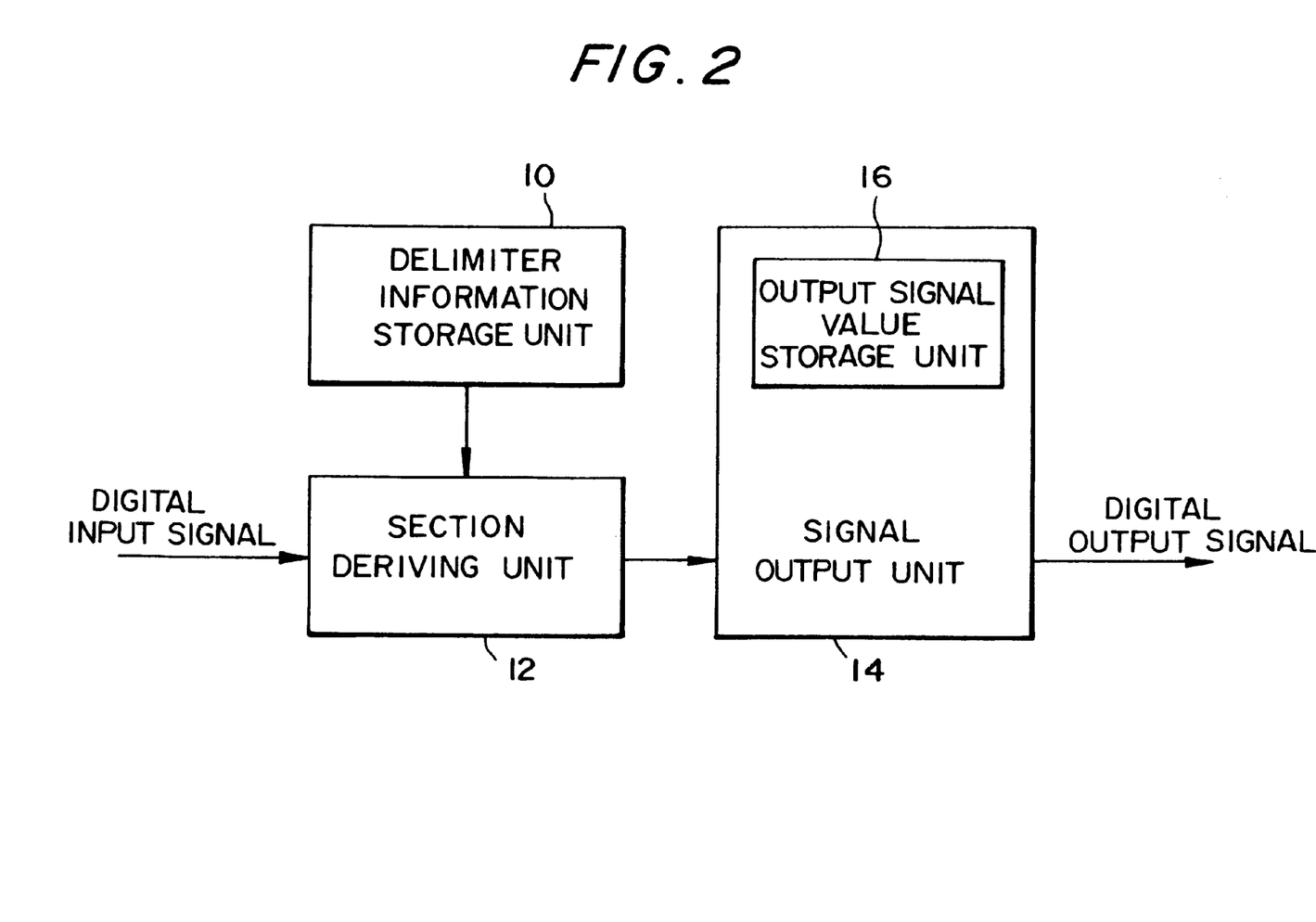
FIG. 2 is a functional block diagram of the lookup table device according to the first embodiment of the present invention.

FIG. 2 is a functional block diagram of the lookup table device according to the first embodiment. The lookup table device comprises a delimiter information storage unit 10, a section deriving unit 12 and a signal output unit 14 which includes an output signal value storage unit 16.

The delimiter information storage unit is formed by RAM, ROM, register and the like and stores digital input signal values indicating delimiters in the sections of the digital input signal that are defined by the respective values of the digital output signal, as delimiter information.

Figure 3A:
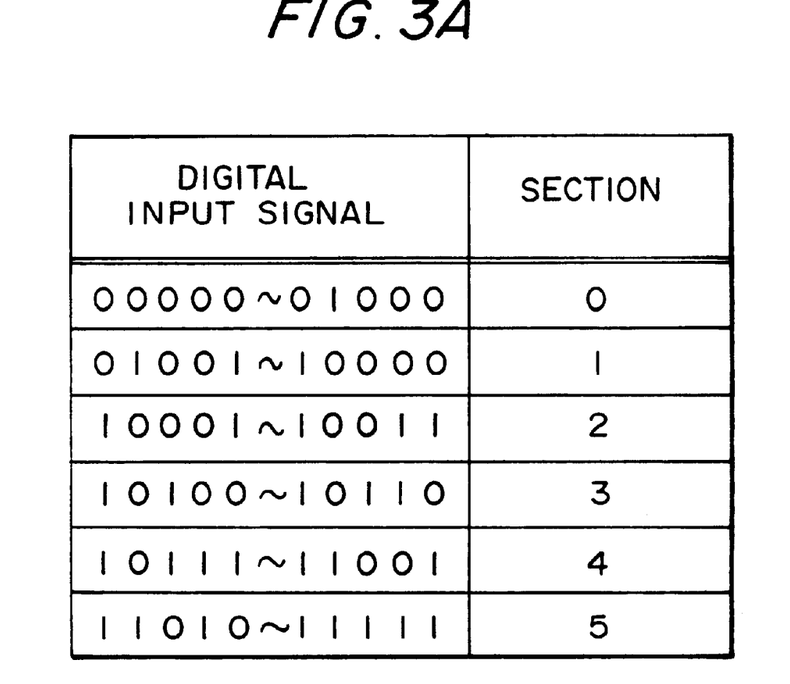
FIGS. 3A and 3B are views illustrating a delimiter information table and an output value table in the lookup table device according to the first embodiment of the present invention.

FIG. 3A is a view illustrating a delimiter information table stored in the delimiter information storage unit 10. The delimiter information table has stored, as delimiter information, digital input signal values which belong to the respective sections 0 to 5.

The section deriving unit 12 is formed by digital signal processing means such as CPU or random logic. The section deriving unit 12 derives a section to which a digital input signal belongs, based on the delimiter information table stored in the delimiter information storage unit 10.

Figure 3B:
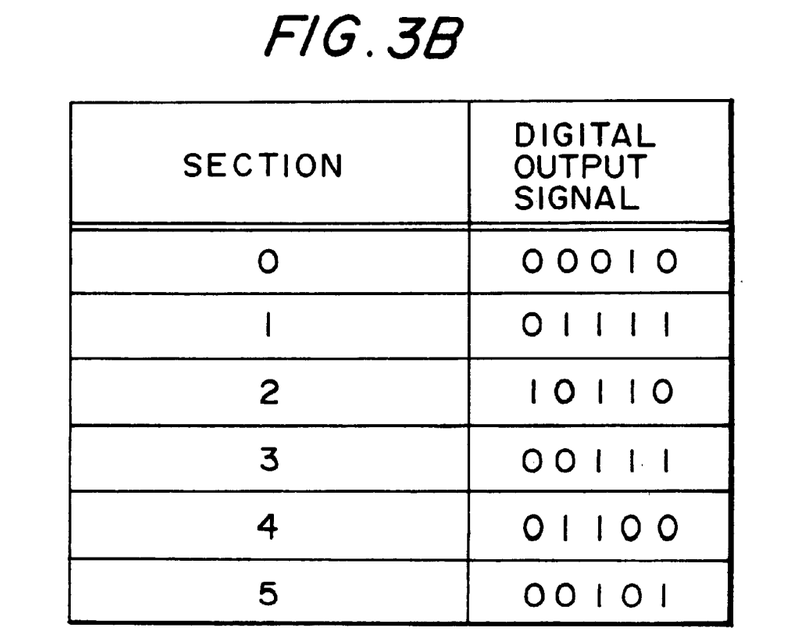

The output signal value storage unit 16 is formed of RAM, ROM, register and the like and stores the digital output signal value corresponding to the respective sections. FIG. 3B is a view illustrating an output signal value table to be stored in the output signal value storage unit. The output signal value table has stored the digital output signal values corresponding to the respective sections 0 to 5.

The signal output unit 14 is formed by digital signal processing means such as CPU or random logic. The signal output unit 14 outputs, as a digital output signal, the values of the output signal value table which have been stored in the output signal value storage unit 16 corresponds to the respective sections derived by the section deriving unit 12.

According to the lookup table device thus arranged, when a digital input signal is inputted, the section deriving unit 12 first compares the delimiter information stored in the delimiter information table of the delimiter information storage unit with the inputted digital signal and then derives one of the sections 0 to 5 to which that digital input signal belongs. Thereafter, the signal output unit 14 reads a value of the digital output signal corresponding to the derived section to which the digital input signal belongs out of the output signal value table of the output signal value storage unit 16, the read value being then outputted as a digital output signal.

As described, the lookup table device is advantageous in that less number of table values to be stored in the memory is required, in comparison with the prior art lookup table device wherein the digital input and output signals have previously been stored in the table with one-to-one correspondence, particularly when the type of actually outputted digital output signal values is less than that of the digital input signal values, as shown in FIG. 1.

The signal output unit may form digital output signals by performing a given computation to signals indicating the sections. Thus, digital signals can be outputted without provision of the aforementioned output signal value storage unit.

The delimiter information and output signal values tables shown in FIGS. 3A and 3B are not necessarily stored in separate storage media, respectively. If one and the same storage medium has stored a set of table consisting of values representing the sections (=0 to 5), delimiter information and output signal values, the lookup table device can be further simplified in structure.

Second Embodiment

The second embodiment relates to a lookup table device which converts a 5-bit digital input signal into a 4-bit digital output signal which has previously been defined.

Figure 4:
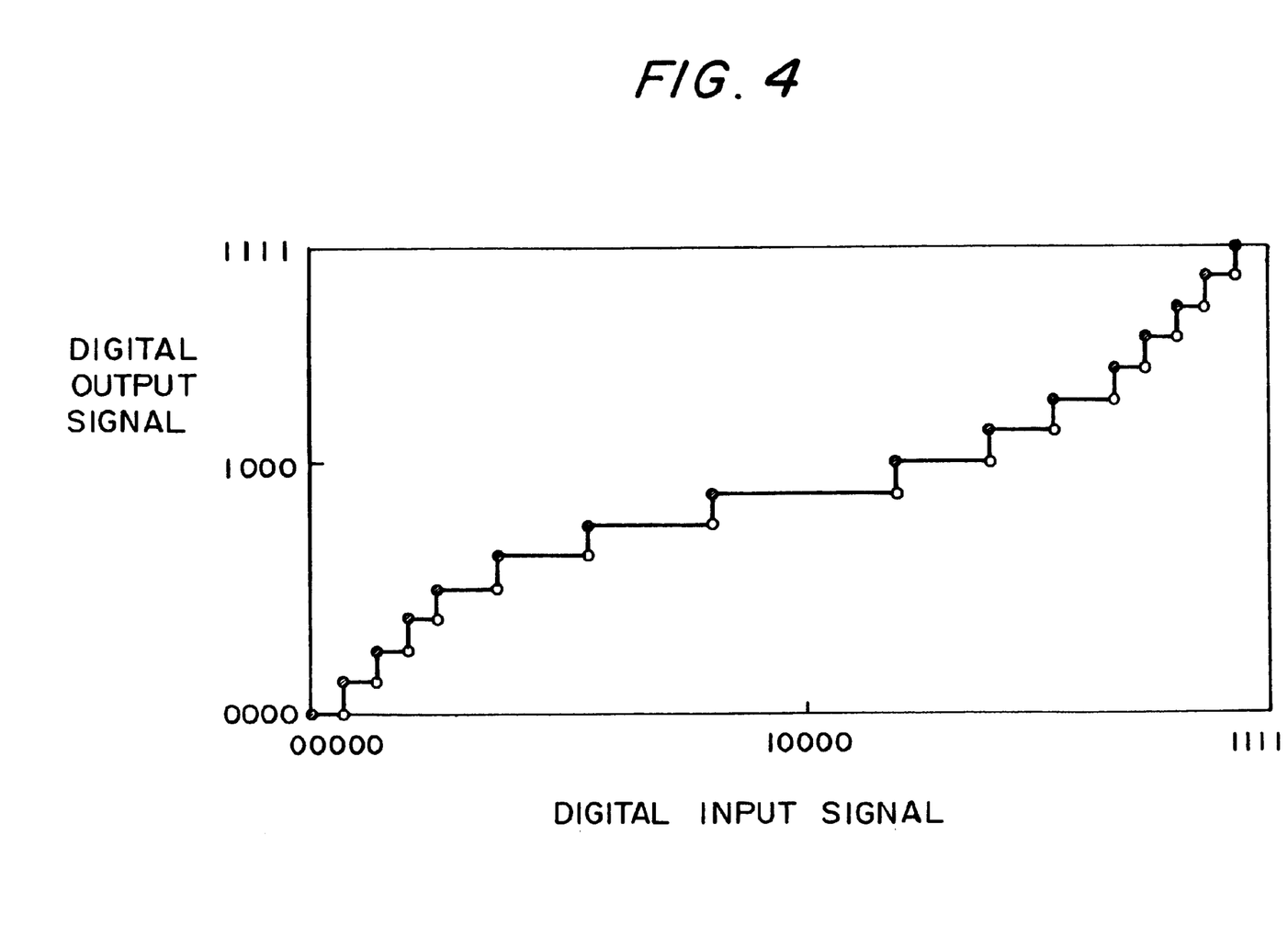
FIG. 4 is a view illustrating the relationship between digital input and output signals in a lookup table device according to a second embodiment of the present invention.

FIG. 4 is a view illustrating the relationship between the digital input and output signals in the lookup table device according to the second embodiment. In this figure, the abscissa axis shows the values of the digital input signal represented by binary numbers while the ordinate axis shows the values of the digital output signal represented by binary numbers.

As shown in FIG. 4, the lookup table device correlates the digital input and output signals with each other so that the digital output signal value monotonously increases with increase of the digital input signal value. The digital output signal has 16 digital signal values "0000" to "1111" which correspond to the respective digital input signal values.

Figure 5:
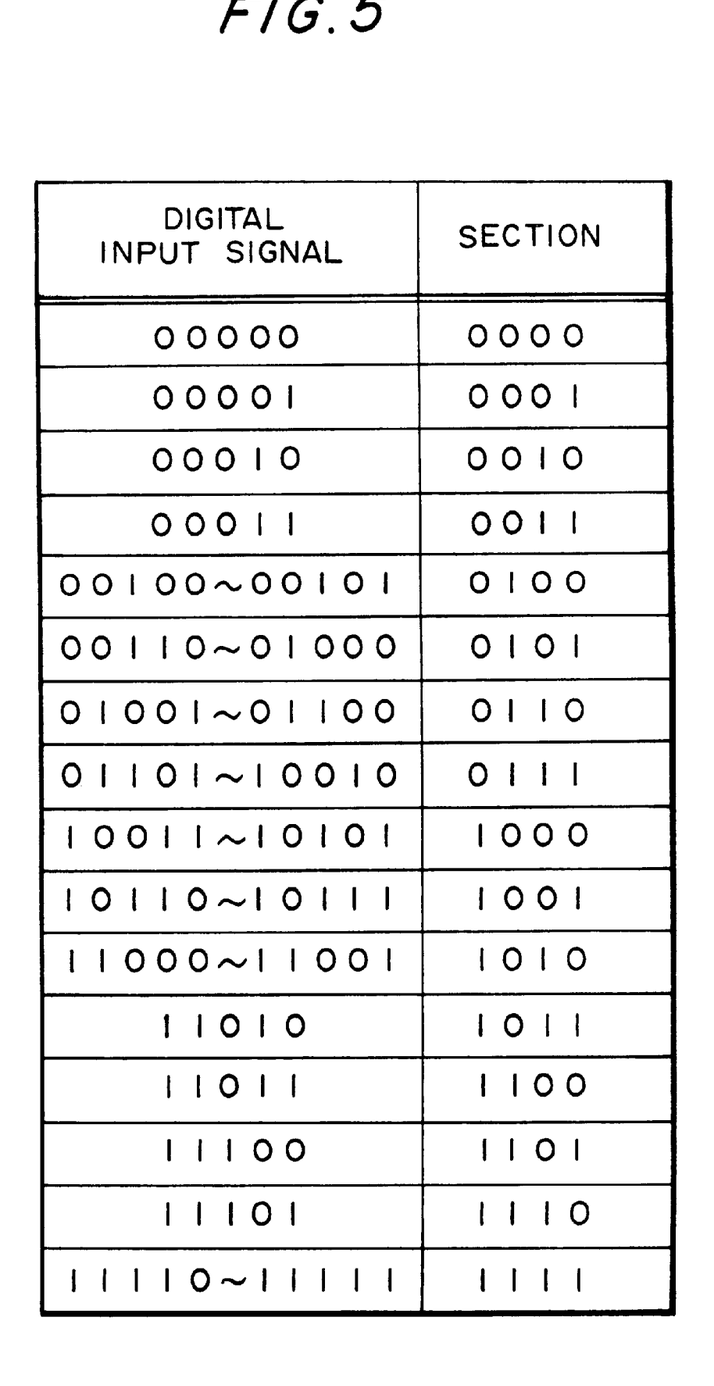
FIG. 5 is a view illustrating the relationship between a range of the digital input signal values corresponding to the respective digital output signal values and values indicating sections defined corresponding to the range in the lookup table device according to the second embodiment of the present invention.

FIG. 5 is a view illustrating the relationship between the range of digital input signal values corresponding to the respective digital output signal values and values indicating the sections defined corresponding to the range.

A binary number which increases sequentially starting from the minimum value of the digital input signal values that are included in the respective sections is assigned to the value of each section (at right column in FIG. 5). As will be apparent from comparison between the ordinate axis of FIG. 4 and the right column of FIG. 5, the number assigned to each section is equal to the actually outputted digital output signal value.

In the second embodiment, it is successfully accomplished that the delimiter information table in the aforementioned lookup table device according to the first embodiment is caused to have a function of storing the actually outputted digital output signal values by coinciding the section values with the actual digital output signal values. As a result, a table for storing the output values in the lookup table device according to the first embodiment can be omitted.

Figure 6:
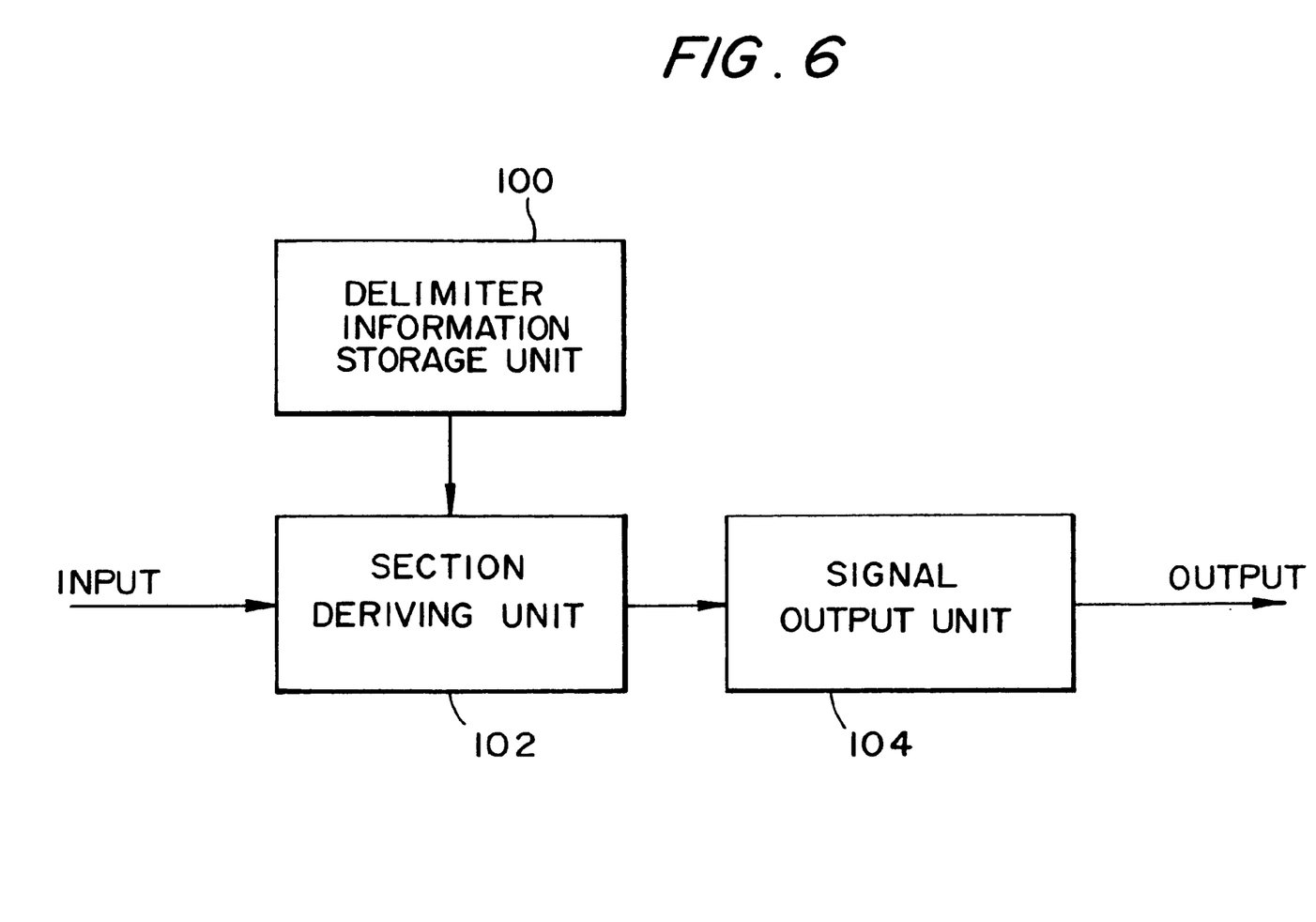
FIG. 6 is a functional block diagram of the lookup table device according to the second embodiment of the present invention.

FIG. 6 is a functional block diagram of the lookup table device according to the second embodiment. As shown in this figure, the lookup table device comprises a delimiter information storage unit 100, a section deriving unit 102 and a signal output unit 104.

Figure 7:
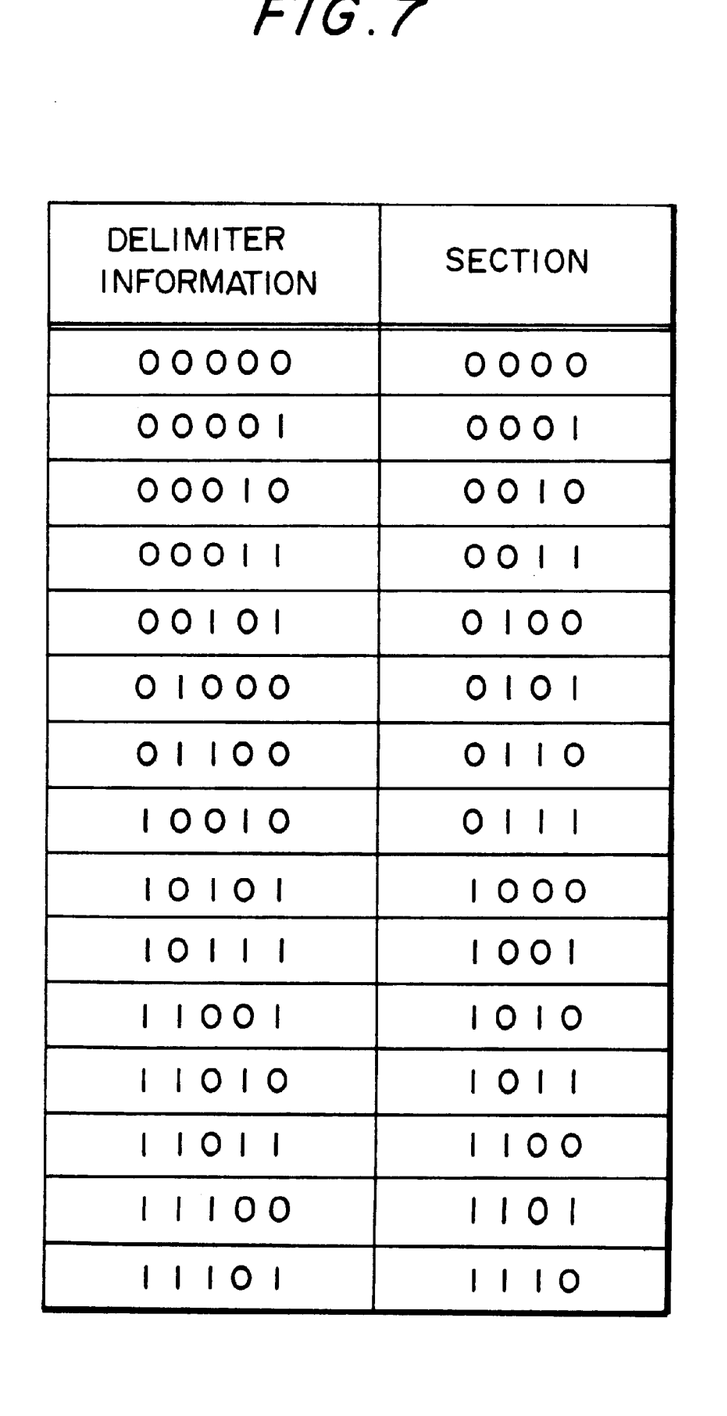
FIG. 7 is a view illustrating the stored contents of a delimiter information storage unit in the lookup table device according to the second embodiment of the present invention.

The delimiter information storage unit 100 stores a delimiter information table in which delimiter information indicating delimiters in the sections is caused to correspond to the section values. FIG. 7 is a view illustrating the delimiter information table which has stored the maximum digital input signal value among the digital input signal values belonging to the respective sections shown in FIG. 5 as delimiter information. For example, digital input signal values corresponding to a section "0111" in FIG. 5 are "01101" to "10010". In this case, the delimiter information table shown in FIG. 7 has stored the section value "0111" and the delimiter information "10010" which are caused to correspond to each other.

More particularly, the delimiter information storage unit 100 is formed by a storage means such as RAM, ROM and stores the delimiter information values at the respective addresses which correspond to the numbers of the sections written in the delimiter information table.

The section deriving unit 102 derives a section to which a digital input signal belongs, based on the delimiter information table that is stored in the delimiter information storage unit 100.

The signal output unit 104 outputs a digital signal corresponding to the section derived by the section deriving unit 102. In the lookup table device of the second embodiment, the signal output unit 104 directly outputs the section derived by the section deriving unit 102 as a digital output signal, particularly since the section value is equal to the digital output signal value, as described.

Figure 8:
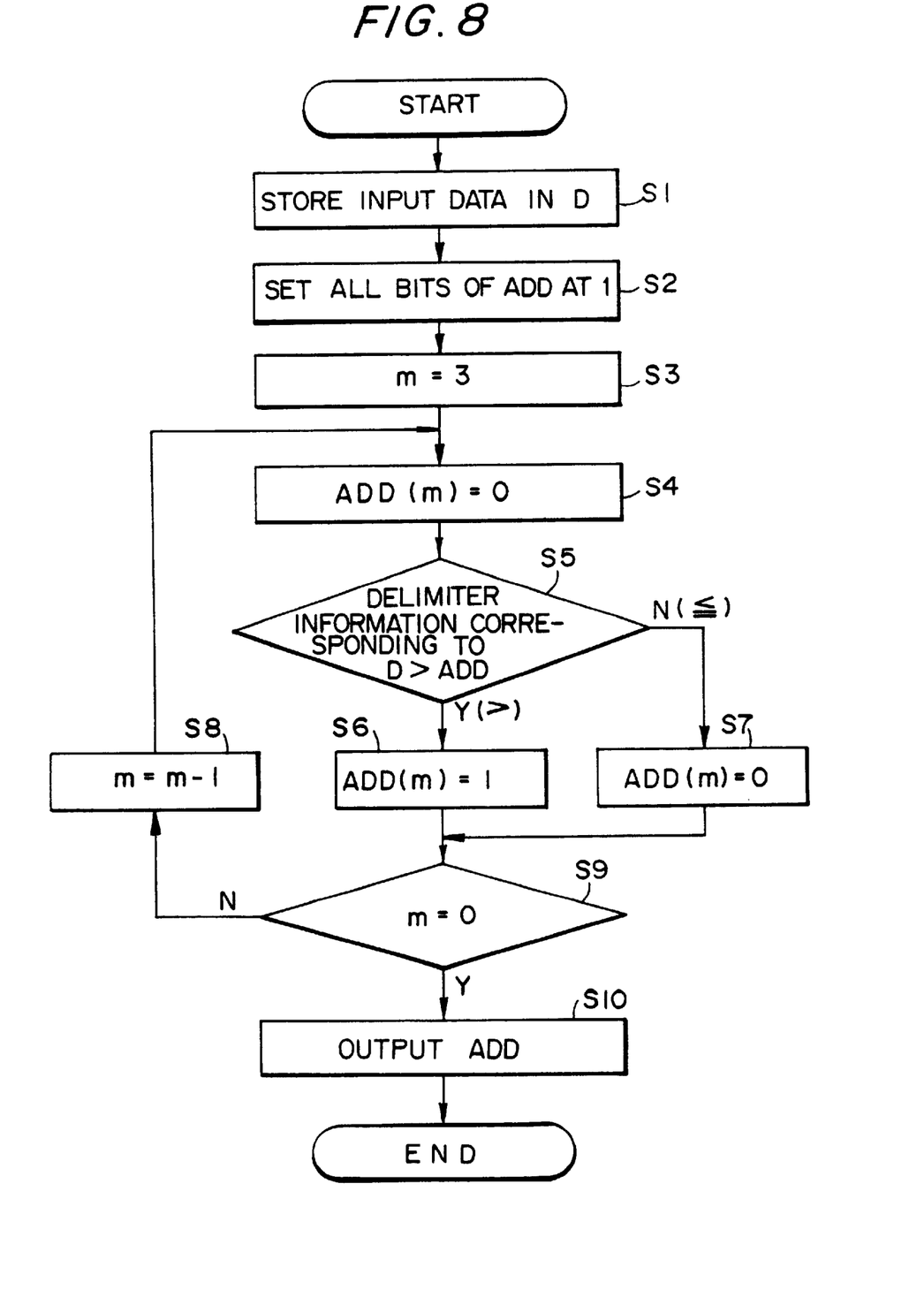
FIG. 8 is a flow diagram illustrating the procedure of deriving sections in the section deriving unit of the lookup table device according to the second embodiment of the present invention.

The procedure of deriving the section in the section deriving unit 102 will now be described in connection with FIG. 8 which is a flow chart illustrating the procedure of deriving the section in the section deriving unit 102 of the lookup table device according to the second embodiment.

When a digital input signal is inputted into the lookup table device, the value of the digital input signal is first stored into a variable D which storage area is secured in a memory or the like (S1). A storage area ADD which is 4-bit string is then secured in the memory or the like, in which all the bits are stored (S2). Three is substituted for a count m on the basis of the bit number 4 of the digital output signal (S3) and zero is stored in the most significant bit ADD (3) in the bit string ADD (S4). Thus, in this stage, bit string ADD is stored as "0111". The term ADD (m) (m=0-3) represents each bit in the bit string ADD; ADD (0) represents the least significant bit in the bit string ADD and ADD (3) represents is the most significant bit in the bit string ADD.

The section deriving unit 102 then reads the delimiter information "10010" corresponding to the section numbered by the same number as ADD="0111" out of the delimiter information table stored in the delimiter information storage unit 100 (see FIG. 7), and compares the delimiter information "10010" with the variable D which is the digital input signal value (S5).

If the digital input signal value D is larger than the delimiter information value, the most significant bit ADD (3) is set to be equal to one (S6). If not so, the most significant bit ADD (3) is set to be equal to zero (S7). This is again stored.

The count m is decremented by one to be equal to two (S8) and ADD (2) is set to be equal to zero (S4). Thereafter, the steps S4 to S8 are repeated until the value m becomes equal to zero (S9). After such a repetition of the process that makes value m zero, the bit string ADD is outputted (S10).

The bit string ADD thus outputted has the same value as the number representing the section to which the digital input signal belongs. The signal output unit 104 outputs the digital output signal on the basis of the value of this bit string ADD. As described, the lookup table device of the second embodiment is characterized by the values of the delimiter information table stored in the delimiter information storage unit 100. Thus, the value of the bit string ADD is equal to the actual digital output signal value. As a result, the signal output unit 104 is only required to output the digital output signal obtained by the section deriving unit 102 directly as a digital output signal.

As described, the output signal value storage unit which is required by the lookup table device according to the first embodiment can be omitted from the lookup table device according to the second embodiment by determining the values of the delimiter information table so that the value of the bit string representing the respective one of the sections will be equal to the digital output signal value.

The lookup table device according to the second embodiment may be embodied in any of various forms. For example, the procedure of deriving the section in the section deriving unit may be accomplished by sequentially determining a section to which the digital input signal belongs from a section corresponding to the minimum value "0000" to another section corresponding to the maximum value "1111".

Although the lookup table device of the second embodiment directly uses a section indicating number as a digital output signal, such a signal may be outputted after it has been subjected to a given computation such as a magnification by constant value or a bit operation in which a constant value is added thereinto. In other words, a desired output signal can be obtained by performing an operation in which the bit string ADD is shifted by a given number of times or an operation in which a given bit string is added to or subtracted from the bit string ADD, without very increase of the processing load.

Third Embodiment

Figure 9:
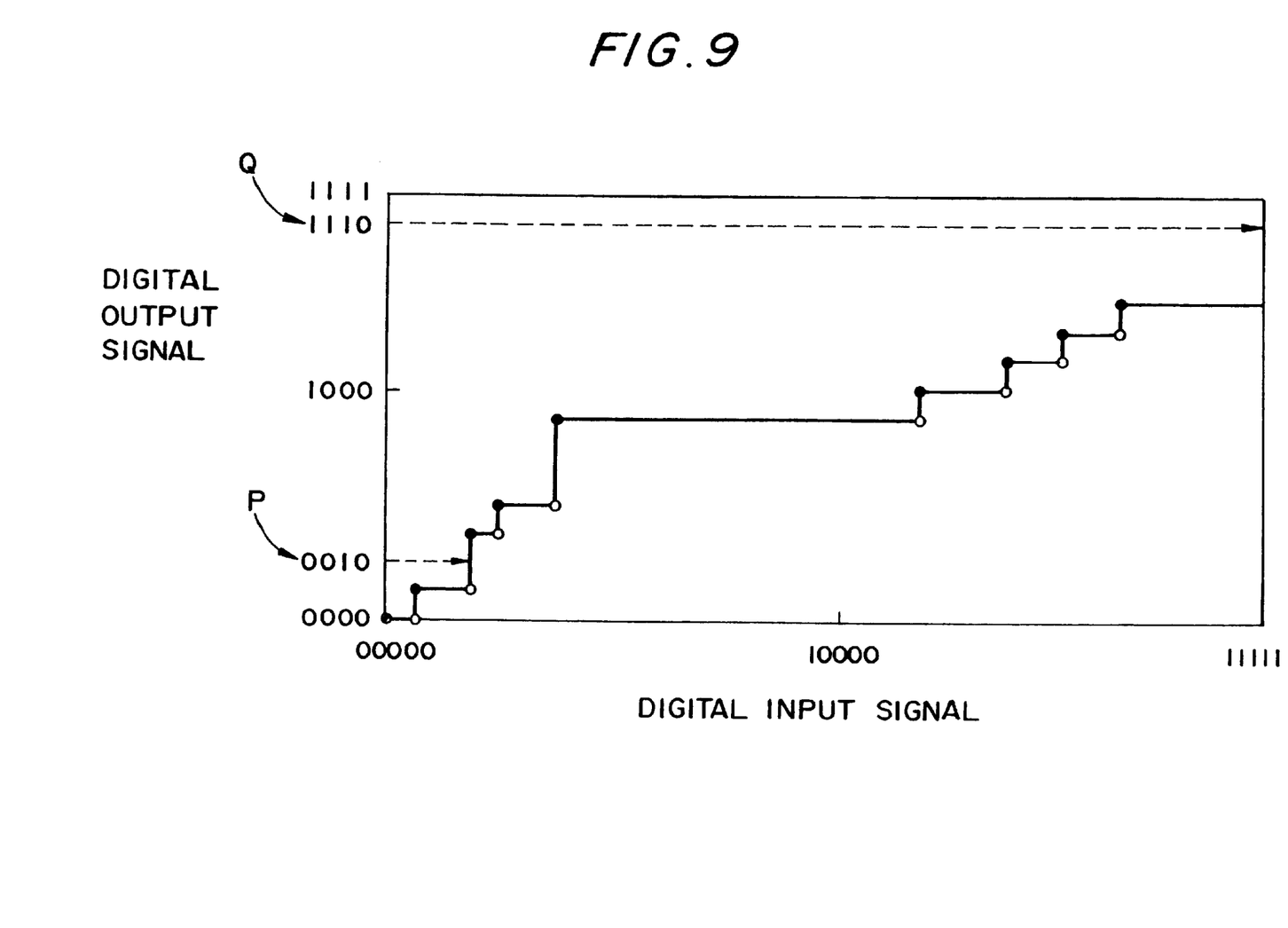
FIG. 9 is a view illustrating the relationship between digital input and output signals in a lookup table device according to a third embodiment of the present invention.
Figure 10:
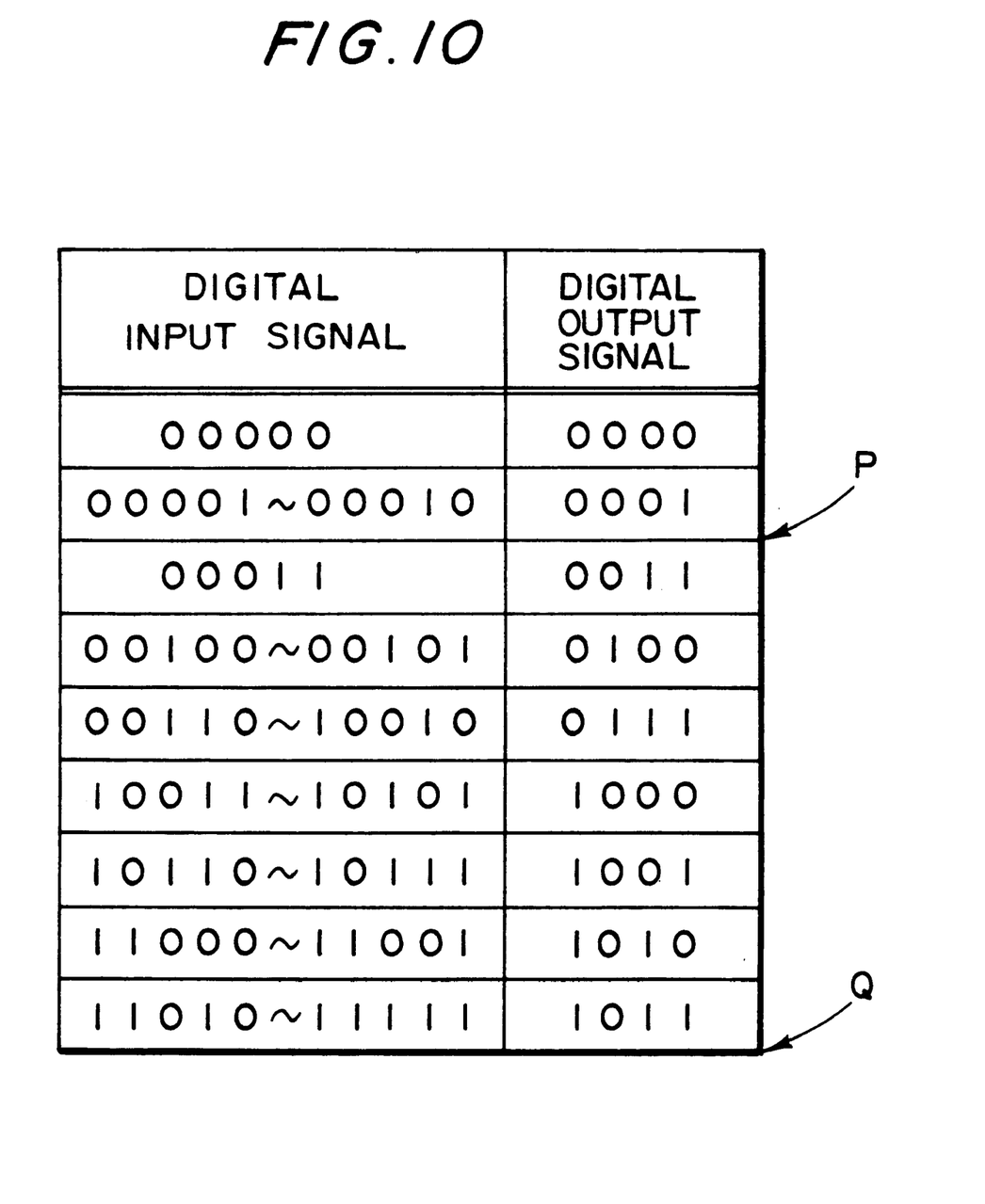
FIG. 10 is a view illustrating the relationship between the digital output signal values and the range of the digital input signal values corresponding to the digital output signal in the lookup table device according to the third embodiment of the present invention.

The third embodiment provides a lookup table device which is of a structure similar to that of the lookup table device according to the second embodiment and which can perform a preferred signal conversion even if a digital output signal does not merely correspond to a section, as shown in FIGS. 9 or 10.

As will be apparent from these figures, the digital output signal does not take all the values. For example, an output signal "0010" (see reference numeral P in FIGS. 9 and 10) or "1110" (see Q in FIGS. 9 and 10) will not be outputted when any digital input signal is inputted into the lookup table device.

Even if one-to-one correspondence between the digital output signal and the section is not provided and the digital output signal value associated with transition of the section, the digital signal conversion can be simply realized by changing the table value stored in the delimiter information storage unit with the same structure as that of the lookup table device according to the second embodiment.

Figure 11:
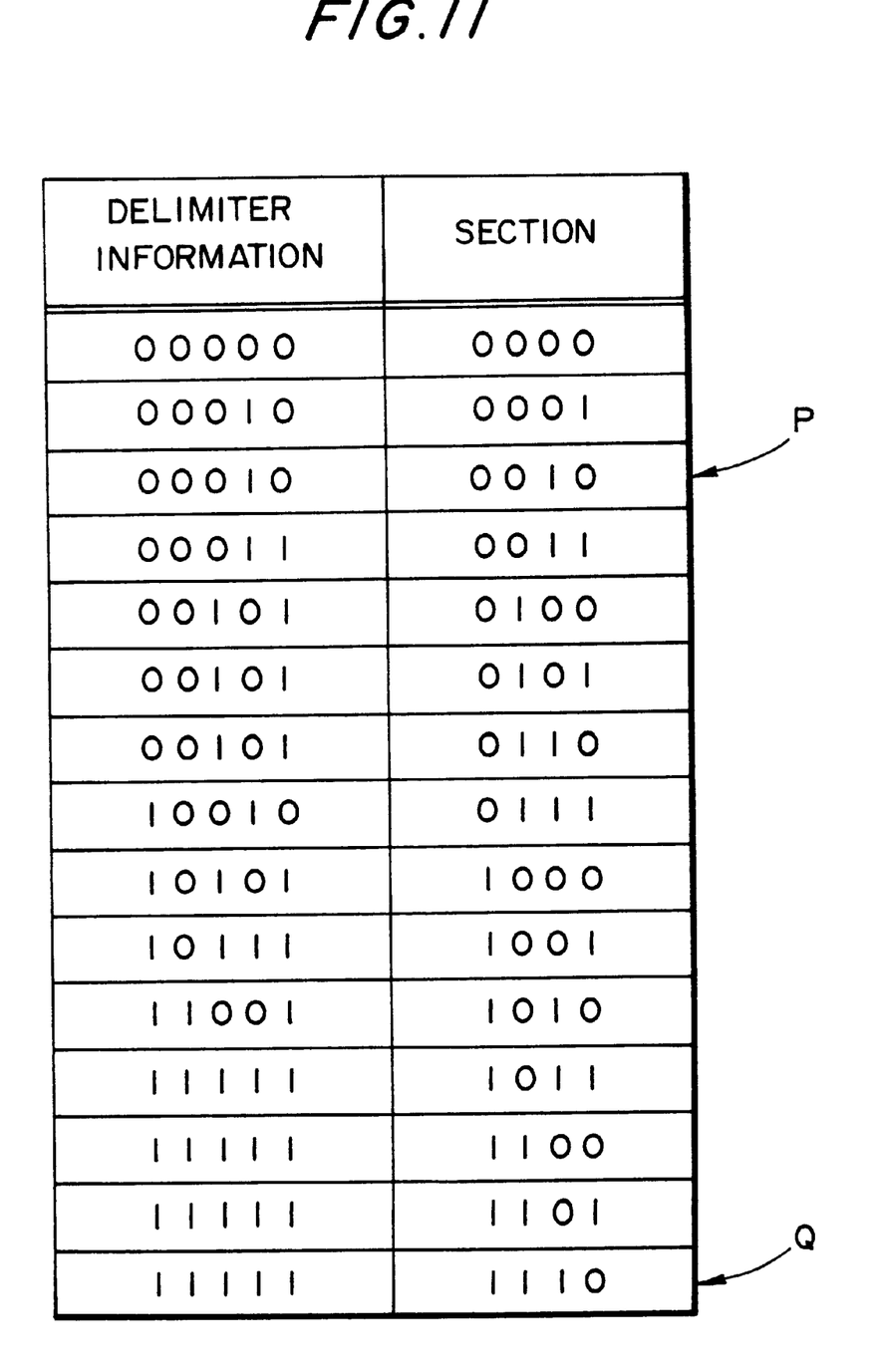
FIG. 11 is a view illustrating the stored contents of a delimiter information storage unit in the lookup table device according to the third embodiment of the present invention.

More particularly, according to the third embodiment, the delimiter information storage unit provided by the lookup table device according to the second embodiment has previously stored a delimiter information table which indicates the correspondence between the delimiter information values shown in FIG. 11 and the values indicating the sections. The delimiter information table shown in FIG. 11 stores, as delimiter information of the section, the maximum digital input signal belonging to each of the sections, based on the correspondence between the digital input signal values and the section values shown in FIG. 10. At this point, the a aforementioned digital signals such as "0010" or "1110" which will not actually be outputted correspond to a virtual section having its section width 0 for convenience. More particularly, such a virtual section stores delimiter information, as a corresponding delimiter information, corresponding to a section in which its section value is one small value. For example, delimiter information "00010" corresponding to a section "0001" is stored as delimiter information corresponding to a section "0010".

In such a manner, a value indicating a section will be equal to a digital output signal value. In this case, the signal conversion can be preferably carried out without provision of any separate output value table.

We claim:

1. A lookup table device for converting a digital input signal into a digital output signal previously defined in correspondence to the digital input signal, comprising:

delimiter information storage means for storing delimiter information representing a delimiter of a section of the digital input signal corresponding to the respective values of the digital output signal;

section deriving means for deriving a section to which the digital input signal belongs, based on said delimiter information stored in said delimiter information storage means, when the digital input signal is inputted; and signal output means for outputting the digital output signal corresponding to a section derived by said section deriving means.

2. The lookup table device according to claim 1, wherein said signal output means includes output signal value storage means for storing the value of the digital output signal corresponding to the respective said sections, and outputs the digital output signal value corresponding to the section derived by said section deriving means among the digital output signal values stored in said output signal value storage means.

3. A lookup table device for converting a digital input signal input through an n-bit signal line into a digital output signal which has been previously defined to monotonously increase or decrease its value corresponding to increase of the digital input signal value and which will be outputted through a k-bit signal line, comprising:

delimiter information storage means for storing delimiter information representing delimiters in $2^k$ numbers of sections of the digital input signal and corresponding to the respective value of the digital output signal;

section deriving means for deriving a section to which the digital input signal belongs, based on said delimiter information stored in said delimiter information storage means, when the digital input signal is inputted; and signal output means for outputting the digital output signal corresponding to a section derived by said section deriving means.

4. The lookup table device according to claim 3, wherein said delimiter information storage means stores said delimiter information so that the digital output signal which does not correspond to any digital input signal and will not be outputted corresponds to a virtual section of which section width is zero.

5. A method of signal conversion for converting a digital input signal into a digital output signal previously defined with respect to the digital input signal, comprising the steps of:

defining sections in the digital input signal corresponding to the respective output values of the digital output signal and, storing delimiter information representing delimiters in these sections in delimiter information storage means;

deriving a section to which the digital input signal belongs, based on said delimiter information stored in said delimiter information storage means, when the digital input signal is inputted thereinto; and outputting the digital output signal corresponding to the derived section.

6. A method of signal conversion for converting a digital input signal into a digital output signal previously defined with respect to the digital input signal comprising the steps of:

defining sections in the digital input signal corresponding to the respective output values of the digital output signal, storing delimiter information representing delimiters in these sections in delimiter information storage means, and storing the value of the digital output signal corresponding to each of said sections in output signal value storage means;

deriving a section to which the digital input signal belongs, based on said delimiter information stored in said delimiter information storage means, when the digital input signal is inputted thereinto; and selecting and outputting the digital output signal corresponding to the derived section from the values of the digital output signal stored in said output signal value storage means.

7. A method of signal conversion for converting a digital input signal input through an n-bit signal line into a digital output signal which has been previously defined to monotonously increase or decrease its value simply corresponding to increase of the digital input signal value and which will be outputted through a k-bit signal line, comprising the steps of:

dividing the digital input signal into $2^k$ numbers of sections corresponding to the respective values of the digital output signal, and storing delimiter information representing a delimiter of said section in delimiter information storage means;

deriving a section to which the digital input signal belongs, based on said delimiter information stored in said delimiter information storage means, when the digital input signal is inputted; and outputting the digital output signal corresponding to a section to be derived.

8. The method of signal conversion according to claim 7, wherein said delimiter information storage means stores said delimiter information so that the digital output signal which does not correspond to any digital input signal and will not be outputted corresponds to a virtual section of which section width is zero.

* * * * *